Dec. 13, 1966 R. W. DREYER 3,290,756

METHOD OF ASSEMBLING AND INTERCONNECTING ELECTRICAL COMPONENTS

Filed Aug. 15, 1962 3 Sheets-Sheet 1

INVENTOR.
ROY W. DREYER,
BY Charles S. Haughey
ATTORNEY

Dec. 13, 1966 R. W. DREYER 3,290,756

METHOD OF ASSEMBLING AND INTERCONNECTING ELECTRICAL COMPONENTS

Filed Aug. 15, 1962 5 Sheets-Sheet 2

INVENTOR.
ROY W. DREYER,
BY
Charles S. Haughey
ATTORNEY.

3,290,756

METHOD OF ASSEMBLING AND INTERCONNECTING ELECTRICAL COMPONENTS

Roy W. Dreyer, Orange, Calif., assignor to Hughes Aircraft Company, Culver City, Calif., a corporation of Delaware Filed Aug. 15, 1962, Ser. No. 217,110
4 Claims. (Cl. 29—155.5)

This invention relates to microminiature electronic circuit connections, and particularly to a technique for interconnecting into a circuit board type of package a variety of components and external leads thereto.

Electronic components are becoming commercially available, with excellent properties, in microminiature sizes, and with varying diameters and uniform thicknesses. Packaging techniques for such small units should be inexpensive, adaptable to mechanization and highly reliable, and the assembled package should have high power dissipation ratings. The present invention satisfies these requirements and allows the production of circuit boards having components, conductive circuit elements, circuit protective material and leads in a single assembly and bonding step with great precision and low cost.

In the present invention, a plurality of electrical components are inserted into holes in a component board with electrode surfaces of the components substantially parallel with the surface of the component board; an insulating sheet having a connecting pattern of conductive adhesive on one surface thereof is placed in contact with the surface of the board and the components; and the adhesive is cured to physically bond the sheet to the components and to the board, and to provide electrical connections to the components.

In a preferred embodiment of the invention, a component board 0.030 inch thick of reinforced epoxy is provided with a plurality of holes of diameters large enough to accommodate components, preferably with some clearance for ease of assembly. Upper and lower uncured sheets of 0.005 inch thick fiberglass-reinforced insulating epoxy are provided with patterns on one side of each sheet of uncured conductive epoxy (applied by silk screen process, stenciling or painting). A flexible cable is provided with multiple conductors, the ends of which are exposed for electrical connection. Components are then assembled into the desired holes of the component board with electrodes exposed in the plane of the component board surfaces, and the cover sheets are assembled therewith, with the conductive epoxy patterns in register and contact with the component electrodes and the flexible cable conductor ends. This assembly, or "sandwich," is next subjected to heat and pressure to cure the epoxy and complete the bond of the cover sheets to the component board, components and flexible cable. The resultant product incorporates the internal circuit connections through the conductive adhesive, and is an extremely rugged circuit board of unusually small size and high packing density.

For further consideration of what I believe to be novel and my invention, attention is directed to the following description, the appended claims and the accompanying drawing, in which:

Figure 1:
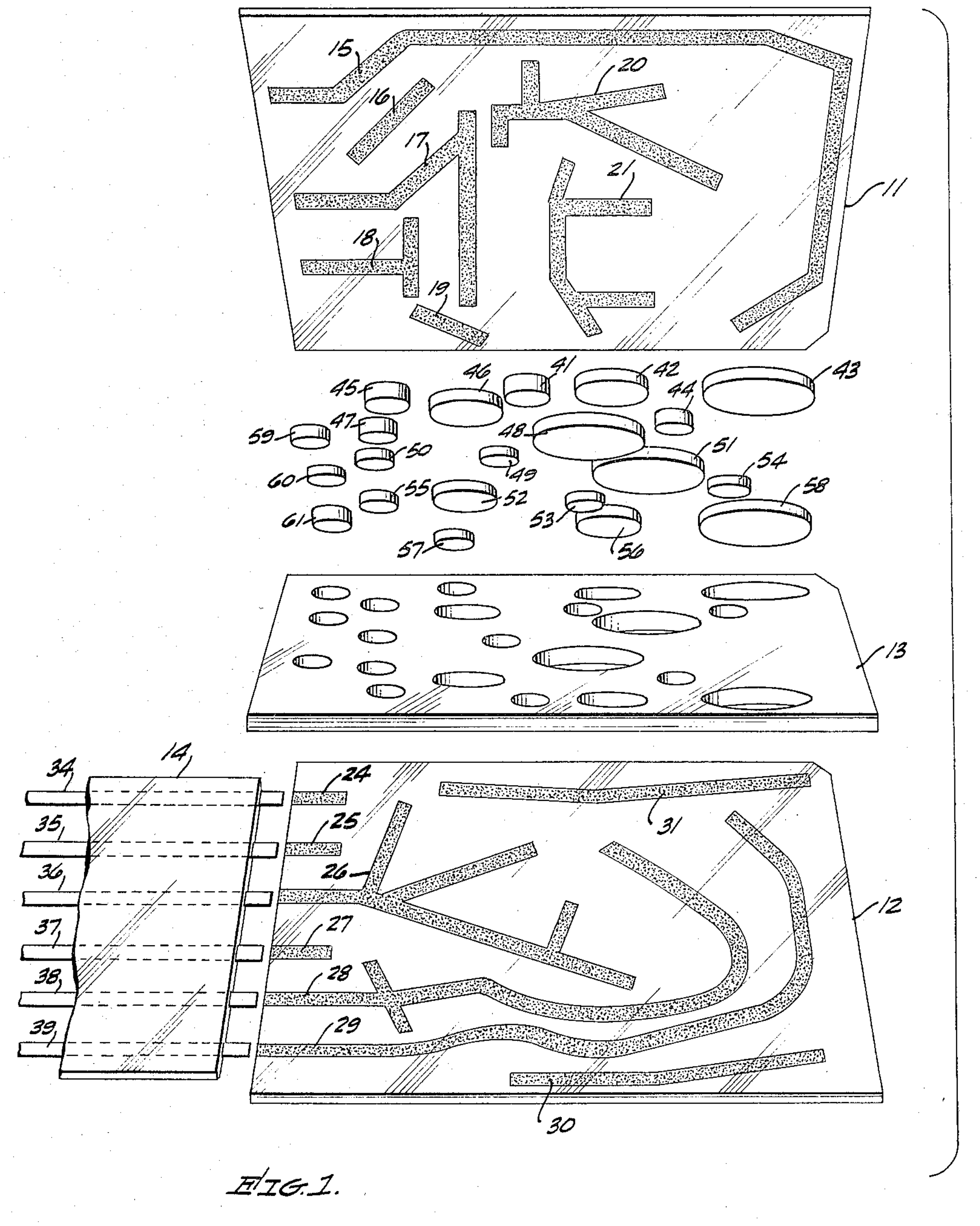
FIG. 1 is an exploded view of materials of a circuit board flip-flop assembly according to this invention.

In FIG. 1, an exploded assembly, shows top and bottom cover sheets 11 and 12, a component board 13, a flexible conductive cable 14, and a plurality of components 41–51 to be assembled into a circuit board.

The cover sheets 11 and 12 are translucent uncured fiberglass-reinforced epoxy sheet .005" thick (the proportions being exaggerated in the drawing), with a conductive pattern of uncured conductive epoxy areas 15–21 and 24–31, applied to a surface thereof. The conductive epoxy contains silver particles for electrical conduction and is applied by silk screen technique, printing, or painting. The upper sheet 11 is subject to bonding to components and the component board 13, and is preferably painted through a stencil or silk screen having the pattern shown in FIG. 2. The lower sheet 12 is painted through stencil or silk screen having the pattern shown in FIG. 3. The sheets 11 and 12 are painted, then dried at 50° C. for one hour to prevent running, and the assembly of FIG. 1 is then made with each component in contact with the desired portion of the respective conductive ink patterns. The materials are preferably assembled in a Teflon jig to avoid adherence to the jig, and the assembly is then placed under pressure by a weight, and heated to 175° C. for one hour to cure the epoxy and complete the bond of the assembly.

Figures 2, 3:
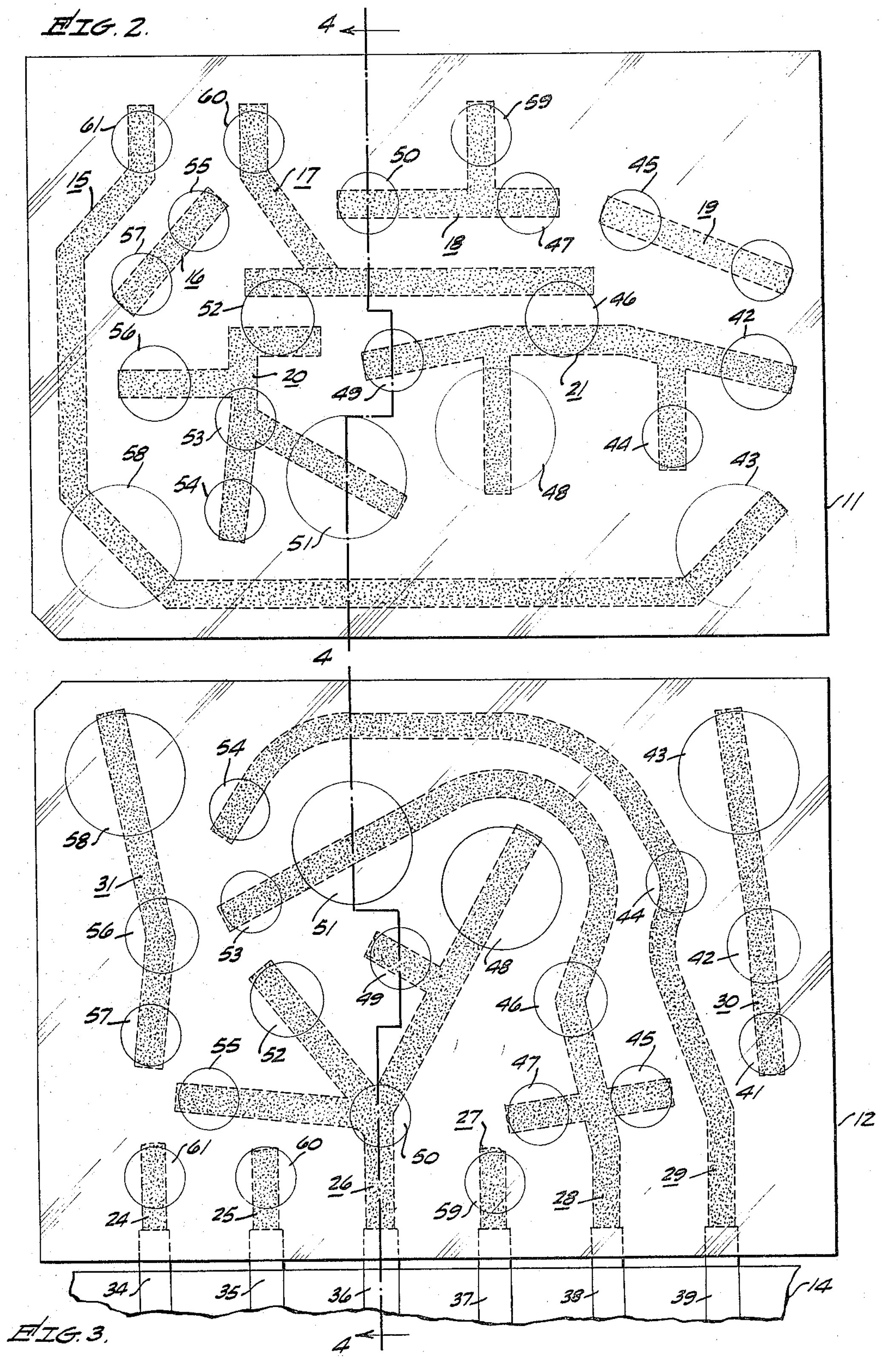
FIGS. 2 and 3 are upper and lower views of the assembled circuit board assembly.
Figure 4:
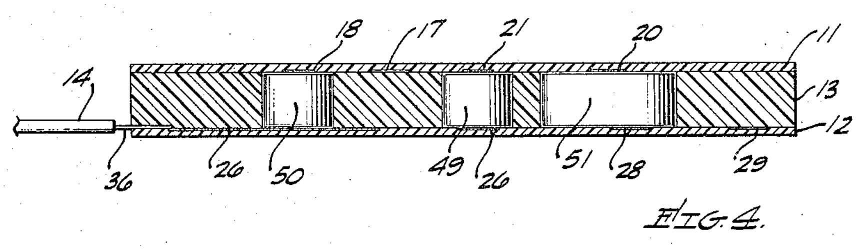
FIG. 4 shows a sectional view of the circuit board of FIGS. 1–3 taken on line 3—3 of FIGS. 2 and 3.

The resulting assembly is shown in FIGS. 2, 3 and 4. FIGS. 2 and 3 show upper and lower sides of the circuit board, with components and conductive epoxy showing through the translucent cover sheets 11 and 12, and the insulated, flat flexible cable 14 is shown connected to conductive areas 24–29 through wires 34–39 of the cable. FIG. 4 shows a cross-sectional view of the assembly on staggered lines 4—4 in FIGS. 2 and 3 passing through components 51, 49 and 50 and through conductive areas 18, 17, 21 and 20 of FIG. 2 and 26, 28 and 29 of FIG. 3.

In this assembly, both the cover sheets and the conductive adhesive are adhesives and when cured the assembly is bonded therethrough to component board 13 as well as to components. Although this construction is preferred, use of conductive adhesive as the only adhesive would bond the components physically and connect them electrically.

This method of assembly does not require bonding of components in the component board holes prior to applying the cover sheets, and no problems of short-circuit through the component board holes occurs; also, clearance space between components and the board 13 present no electrical discontinuity gap problem as is common with evaporated circuit patterns and other methods of applying conductive circuit materials. It is accordingly not necessary to bond the components to the component board prior to the assembly and curing of the cover sheets, and clearances between components and the board 13 may be provided for ease of assembly. Where desired for special properties, special board materials may be used but the cover sheets and conductive adhesive must be capable of bonding to such materials. For example, alumina or anodized aluminum may be used for better power dissipation, and adhesive epoxy materials are suitable for conductive adhesive and cover sheets.

When flexible back-up pads, such as silicone rubber pads, are used to apply pressure to the cover sheets 11 and 12 during bonding, or curing of the adhesive, substantial tolerances may be accommodated in thickness of the components. With component boards of .030" thickness, cover sheets may vary as much as .005" to .015" thick glass fiber reinforced epoxy material, and thickness tolerance of .010 in components may be accommodated.

Figure 5:
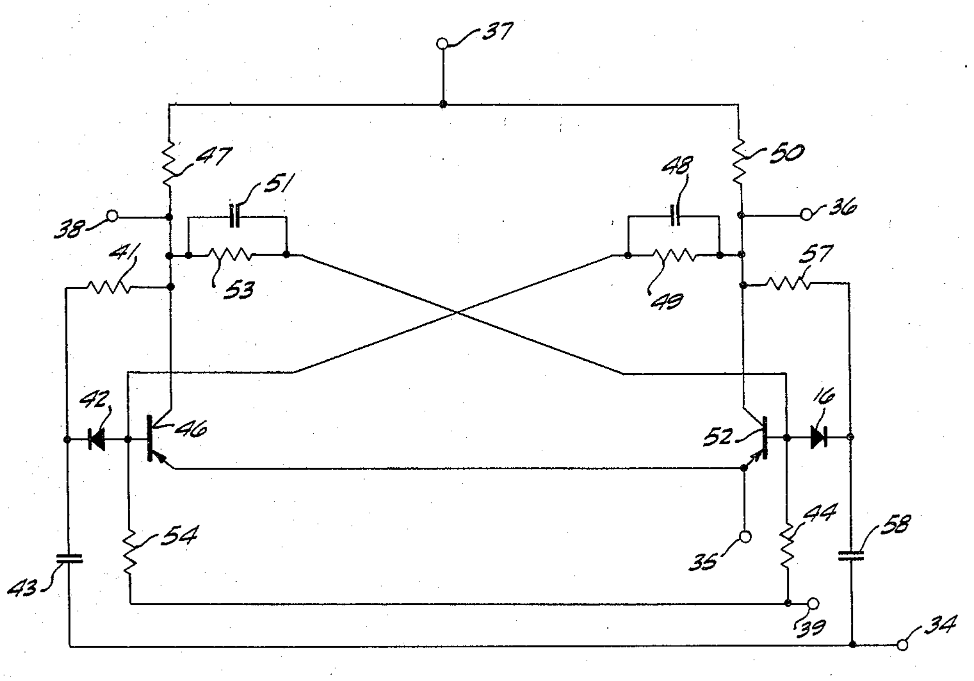
FIG. 5 is a schematic circuit diagram of the flip-flop circuit of the circuit board.

As further illustrated in the schematic diagram of FIG. 5, the flip-flop circuit illustrated comprises eight resistors 41, 44, 47, 49, 50, 53, 54 and 57 of .050" diameter, in holes .052" diameter; two diodes 42 and 56 of .050" diameter; four capacitors 43, 48, 51 and 58 of .100" diameter; five feed throughs, or plugs, 45, 55, 59, 60 and 61 of .050″ diameter; and two transistors 52 and 46 of .080″ diameter, each of which has two electrodes shown in FIG. 2 connected respectively to conductive areas 17, 20 and 17, 21. For each component the hole clearance is .002″ for ease of assembly. The plugs are conductive, such as copper, and are provided to pass the circuit from top face to bottom face, as for the connection of all wires 34–39 in a common plane.

The method of assembly and making circuit connections herein illustrated eliminates shorting of components in bonding components to component boards, eliminates the need for soldering or welding of components to circuit boards, and eliminates the separate step of securing components to the circuit board usually used heretofore. It eliminates the need for close hole tolerances and eases height tolerances of the cylindrical components, makes all mechanical and electrical connections in one step at final assembly, including flexible cable, or if desired, pins or other connector surfaces or devices, and avoids the need for copper clad component or circuit boards, while sealing components under protective cover sheets.

The assembled product is easily subject to replacement of components by punching out one component, inserting a replacement, exposing portions of the conductive areas adjacent the component, and bonding a suitable conductive "patch" over the component to physically and electrically connect it to the assembly.

I claim:

1. A method for mechanically and electrically interconnecting components in a circuit board, which comprises:

(a) forming connecting patterns of uncured conductive adhesive on uncured non-conductive adhesive surfaces of a pair of sheets;

(b) placing components in holes of a component board with electrodes thereof exposed;

(c) contacting said electrodes and component board with said sheets on either side of the component board and exposed components, with the conductive adhesive contacting desired components; and (d) curing said adhesive to form a circuit board having components hermetically sealed between a pair of sheets in a component board.

2. A method according to claim 1 wherein the sheets and the conductive adhesive comprise epoxy resin.

3. A method for mechanically and electrically interconnecting components in a circuit board, which comprises:

(a) forming connecting patterns of uncured conductive adhesive on uncured non-conductive adhesive surfaces of a pair of sheets;

(b) placing components in holes of a component board with electrodes thereof exposed;

(c) contacting said electrodes and component board with said sheets on either side of the component board and exposed components, with the conductive adhesive contacting desired components; and (d) inserting electric terminals between one of said sheets and said component board in contact with said conductive adhesive; and (e) curing said adhesive to form a circuit board having components hermetically sealed between a pair of sheets in a component board.

4. A method for mechanically and electrically interconnecting components in a circuit board which comprises:

(a) forming connecting patterns of uncured conductive adhesive on an uncured non-conductive adhesive surface of a sheet;

(b) placing components in holes of a component board with electrodes thereof exposed;

(c) contacting said electrodes and said component board with said sheet with the conductive adhesive patterns contacting desired components; and (d) inserting electric terminals between said component board and said sheet in contact with the conductive adhesive; and (e) curing said adhesive and adhesive surface to mechanically and electrically bond the sheet to the components and the circuit board, whereby to seal the space between the component board and the component electrode.

References Cited by the Examiner

UNITED STATES PATENTS

| | | | |
|---|---|---|---|
| 2,808,352 | 10/1957 | Coleman et al. | 174—117.6 |
| 2,902,628 | 9/1959 | Leno | 29—155.5 |
| 2,918,287 | 12/1959 | Rosenblum et al. | 29—155.5 |
| 2,945,163 | 7/1960 | Kilby | 317—101 |
| 3,001,104 | 9/1961 | Brown | 317—101 |
| 3,034,198 | 6/1962 | Rayburn et al. | 29—155.5 |
| 3,044,151 | 7/1962 | Coler | 29—155.5 |
| 3,077,511 | 2/1963 | Bohrer et al. | 29—155.5 |
| 3,077,658 | 2/1963 | Wharton | 29—155.5 |
| 3,098,287 | 7/1963 | Buchsbaum | 29—155.5 |
| 3,134,930 | 5/1964 | Wright | 317—101 |
| 3,179,854 | 4/1965 | Luedicke et al. | 317—101 |
| 3,183,407 | 5/1965 | Yasuda et al. | 317—101 |
| 3,184,832 | 5/1965 | Perkins et al. | 29—155.5 |

OTHER REFERENCES

"New Advances in Printed Circuitry," Pub. No. 192, page 15, National Bureau of Standards.

JOHN F. CAMPBELL, *Primary Examiner.*

JOHN H. BURNS, J. G. COBB, J. W. BOCK, R. W. CHURCH, *Assistant Examiners.*